US010115790B2

(12) United States Patent
Grivna et al.

(10) Patent No.: US 10,115,790 B2
(45) Date of Patent: Oct. 30, 2018

(54) ELECTRONIC DEVICE INCLUDING AN INSULATING STRUCTURE

(71) Applicant: SEMICONDUCTOR COMPONENTS INDUSTRIES, LLC, Phoenix, AZ (US)

(72) Inventors: Gordon M. Grivna, Mesa, AZ (US); Steve M. Etter, Phoenix, AZ (US); Hiroyuki Suzuki, Kazo (JP); Miki Ichiyanagi, Ohta (JP); Toshihiro Hachiyanagi, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/252,009

(22) Filed: Aug. 30, 2016

(65) Prior Publication Data

US 2017/0084687 A1    Mar. 23, 2017

Related U.S. Application Data

(60) Provisional application No. 62/219,779, filed on Sep. 17, 2015.

(51) Int. Cl.
*H01L 23/48* (2006.01)
*H01L 29/06* (2006.01)
(Continued)

(52) U.S. Cl.
CPC .... *H01L 29/0649* (2013.01); *H01L 21/76232* (2013.01); *H01L 28/10* (2013.01); *H01L 29/0692* (2013.01); *H01L 29/401* (2013.01); *H01L 29/407* (2013.01); *H01L 29/408* (2013.01)

(58) Field of Classification Search
None
See application file for complete search history.

(56) References Cited

U.S. PATENT DOCUMENTS 6,621,136 B2    9/2003 Grivna
6,683,343 B2    1/2004 Matsudai et al.
(Continued)

OTHER PUBLICATIONS

Non-Final Office Action for U.S. Appl. No. 15/251,984, dated Nov. 30, 2017, pp. 1-9.

(Continued)

*Primary Examiner* — Ali Naraghi
(74) *Attorney, Agent, or Firm* — Able Law Group, LLP

(57) ABSTRACT

An electronic device can include a substrate and an insulating structure. In an aspect, an anchor can include a portion of the substrate that extends into the insulating structure or a portion of the insulating structure that extends into the substrate. In another aspect, a process of forming an electronic device can include patterning a substrate to define a trench and a first anchor; and forming an insulating structure within the trench and adjacent to the first anchor. In a further aspect, a process of forming an electronic device can include patterning a substrate to define a trench having a sidewall and a first pillar spaced apart from the sidewall; doping the first pillar to change a conductivity type of the first pillar; and forming an insulating structure that surrounds the first pillar.

20 Claims, 12 Drawing Sheets

(51) Int. Cl.
*H01L 21/762* (2006.01)
*H01L 49/02* (2006.01)
*H01L 29/40* (2006.01)

(56) References Cited

U.S. PATENT DOCUMENTS

| | | | |
|---|---|---|---|
| 6,818,525 | B1 | 11/2004 | Durham et al. |
| 7,087,925 | B2 | 8/2006 | Grivna |
| 7,253,477 | B2 | 8/2007 | Loechelt et al. |
| 7,452,796 | B2 | 11/2008 | Davies |
| 7,518,185 | B2 | 4/2009 | Hadizad et al. |
| 7,579,632 | B2 | 8/2009 | Salih et al. |
| 7,781,310 | B2 | 8/2010 | Grivna |
| 7,842,969 | B2 | 11/2010 | Marreiro et al. |
| 7,989,319 | B2 | 8/2011 | Grivna |
| 8,012,857 | B2 | 9/2011 | Grivna et al. |
| 8,384,231 | B2 | 2/2013 | Grivna et al. |
| 8,492,260 | B2 * | 7/2013 | Parsey, Jr. ......... H01L 21/76898 257/E21.586 |
| 8,859,396 | B2 | 10/2014 | Grivna et al. |
| 8,981,533 | B2 | 3/2015 | Grivna |
| 9,117,802 | B2 | 8/2015 | Parsey, Jr. et al. |
| 9,142,665 | B2 | 9/2015 | Hirler et al. |
| 9,391,135 | B1 | 7/2016 | Grivna et al. |
| 2002/0030225 | A1 | 3/2002 | Nakamura et al. |
| 2002/0137264 | A1 | 9/2002 | Kao et al. |
| 2003/0062588 | A1 | 4/2003 | Grivna |
| 2005/0176192 | A1 | 8/2005 | Hshieh |
| 2010/0230745 | A1 | 9/2010 | Saito et al. |
| 2011/0140228 | A1 | 6/2011 | Wang et al. |
| 2012/0187527 | A1 | 7/2012 | Guitart et al. |
| 2013/0277807 | A1 | 10/2013 | Parsey, Jr. et al. |
| 2014/0070375 | A1 * | 3/2014 | Grivna ................ H01L 23/481 257/621 |
| 2015/0235866 | A1 | 8/2015 | Nakamura |
| 2015/0357437 | A1 | 12/2015 | Vellei |
| 2015/0380247 | A1 | 12/2015 | Horii et al. |
| 2016/0172464 | A1 | 6/2016 | Grivna |
| 2017/0084705 | A1 | 3/2017 | Grivna |

OTHER PUBLICATIONS

Chung, J.W. et al. "Seamless On-Wafer Integration of Si(100) MOSFETs and GaN HEMTs." IEEE Electron Device Letter, vol. 30, No. 10, Oct. 2009, pp. 1015-1017.
Lindemann, A., "A New IGBT with Reverse Blocking Capability." Entwurf fur EPE Conference, Graz; IXAN0049; pp. 1-7 (2001).
Bakir, Muhannad S., "Interconnect and Heterogeneous Microsystem Integration Technologies". School of Electrical and Computer Engineering, Georgia Institute of Technology, 2015, slides 18 and 26.
Yang, Rongbo, "Through-Silicon-Via Inductor. Is it Real of Just a Fantasy?". Masters Thesis, Missouri University of Science and Technology, 2013, pp. 1-45.
Vanackern, Gary, et al., "On-Chip 3D Indcutors Using Thru-Wafer Vias". College of Engineering, Boise State Universiy, 2012, p. 20.
Motto, E. R. et al., "Application Characteristics of an Experimental RB-IGBT (Reverse Blocking IBGT) Module". IEEE, 0-7803-8480-03; 5 pages (2004).
Jiang, Hongrui, et al., "Fabrication of Thick Silicon Dioxide Sacrificial and Isolation Blocks in a Silicon Substrate". Journal of Micromechanics and Microengineering, 12, (2002), pp. 87-95.
Thadesar, Paragkumar A., et al., "Low-Loss Silicon Interposer for Three-Dimensional System Integration with Embedded Microfluidic Cooling". 2014 Symposium on VLSI Technology Digest of Technical Paper, 2014 IEEE, pp. 156-157.

* cited by examiner

ELECTRONIC DEVICE INCLUDING AN INSULATING STRUCTURE

CROSS-REFERENCE TO RELATED APPLICATION

This application claims priority under 35 U.S.C. § 119(e) to U.S. Patent Application No. 62/219,779 entitled "Deep Trench Isolation Devices and Methods," by Grivna et al., filed Sep. 17, 2015, which is assigned to the current assignee hereof and incorporated herein by reference in its entirety.

FIELD OF THE DISCLOSURE

The present disclosure relates to electronic devices including insulating structures and processes of forming such electronic devices.

RELATED ART

Isolation structures are used to control high electrical fields that can be present with die. The isolation structures can include alternating n-type and p-type regions, insulating layers, or a combination thereof. The alternating regions can limit the flexibility in the design of the electronic device. In another embodiment, a large isolation region can be formed using two insulating layers and a single mask. The large isolation region may require a large amount of insulating material to be deposited and limit equipment throughput. Further improvement in electronic devices and flexibility in designs and high equipment throughput are desired.

BRIEF DESCRIPTION OF THE DRAWINGS

Embodiments are illustrated by way of example and are not limited in the accompanying figures.

Figure 1:
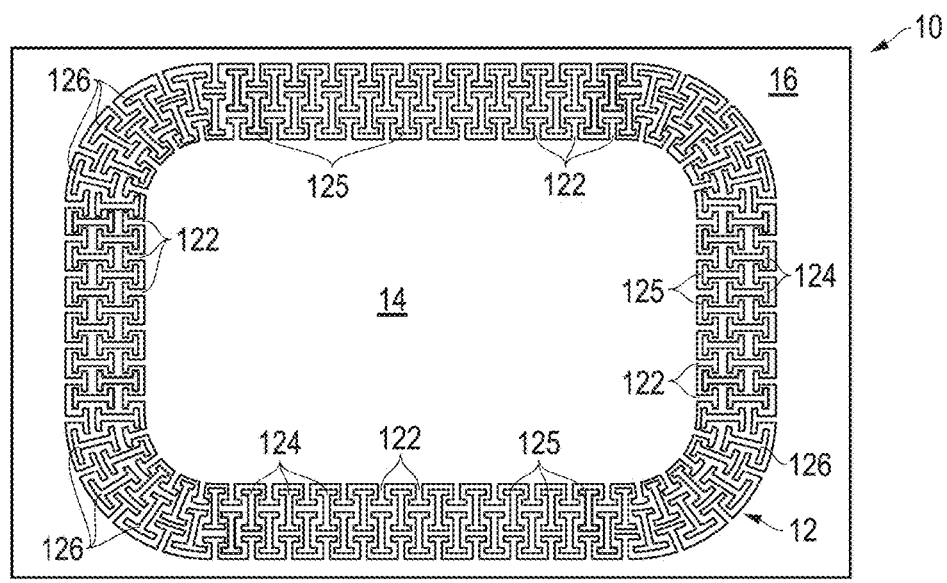
FIG. 1 includes an illustration of a top view of a portion of an electronic device including an insulating structure having anchors and rounded corners.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention. To the extent terms defined below are differ from those in U.S. Pat. No. 8,492,260, the terms as defined below govern in this document.

The term "electronic component" is intended to mean to a component that is or can readily be made part of a circuit. An example of an electronic component includes an active component or a passive component, such as a capacitor, resistor, diode, or the like. An electronic component does not include an interconnect, conductive plug, a via, or the like whose function is to electrically connect at least two electronic components or an electronic component and a terminal to each other. The two electronic components or the combination of the electronic component may be on the same substrate or workpiece or on different substrates or workpieces.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a substrate and an insulating structure. In one aspect, an anchor can include a portion of the substrate that extends into the insulating structure or a portion of the insulating structure that extends into the substrate. Anchors may lie along one or both of opposing sides of the insulating structure. In an embodiment, the anchors of the substrate and the insulating structure can have complementary shapes, and in another embodiment, the anchors can be interlocking features.

The anchors can help to keep the insulating structure attached to the substrate. When subjected to destructive testing, the insulating structure breaks along with the substrate. If anchors are not present, the insulating structure may break or separate from the substrate before the substrate breaks. Accordingly, the insulating structure with anchors has better mechanical integrity when the insulating structure in integrated into the substrate.

In a further aspect, a process of forming an electronic device can include patterning a substrate to define a trench and an anchor; and forming an insulating structure within the trench and adjacent to the anchor. In an embodiment an embedded void may be formed within an insulating layer that extends into a trench of a cavity. The embedded voids help to reduce the thickness and stress of the deposited insulating layers in forming the insulating structure because the entire trench is not being filled with an insulating layer. Thus, the insulating structure can be formed with less insulating material and allows for higher equipment throughput and lower stress.

In another aspect, the substrate includes a body portion and an adjacent portion from which an anchor extends, wherein the adjacent portion has a conductivity type opposite of the body portion. The adjacent can be disposed between the body portion and the anchor. The adjacent portion can act as a field plate to increase the breakdown voltage between different body portions that are separated by the insulating structure. The adjacent portion may be used with insulating structures having anchors to help increase the breakdown voltage between the different body portions.

In still another aspect, a process of forming an electronic device can include patterning a substrate to define a trench having a sidewall and a pillar spaced apart from the sidewall; doping the pillar to change a conductivity type of the pillar; and forming an insulating structure that surrounds the pillar.

Many different embodiments of the present invention may be used. The concepts underlying the present invention are better understood after reading this specification in conjunction with the figures. Skilled artisans will understand the scope of the present invention is not limited to the embodiments as described herein.

FIG. 1 includes an illustration of a top view of a die 10 that can be part of a larger workpiece, such as a semiconductor wafer, before the die 10 is separated from other die (not illustrated in FIG. 1) in other parts of the same workpiece. An insulating structure 12 separates one portion of the die 10, such as an active region 14, from another portion of the die, such as a peripheral region 16 of the die 10. As will be described later, the regions 14 and 16 can include portions of the substrate, and the insulating region 12 can be formed within a trench extending into the substrate.

In FIG. 1, the active region 14 is surrounded by the insulating structure 12, which is surrounded by the peripheral region 16. The active region 14 is spaced apart from the peripheral region 16 by the insulating region 12. In an embodiment, electronic components may be formed in either or both of the regions 14 and 16. In another embodiment, the insulating region 12 is part of a termination region, and peripheral region 16 is near the edge of the die. The insulating region 12 can help to reduce the electric field, transmission of stray signals (noise), or the like between the regions 14 and 16.

The insulating structure 12 can include substrate anchors 122, pillar anchors 125, and pillars 124 and 126. The anchors 122 and 125 help to reduce the likelihood that the insulating structure 12 separates from other parts of the die 10. The substrate anchors 122 include portions of the substrate that extend from each of the regions 14 and 16 into the insulating structure 12. The substrate portion of the substrate anchors 122 can be retained for example when adjacent to an interior active part of the device or removed for example when adjacent to an exterior or inactive part of the die. The anchors 125 include portions of the insulating structure 12 that extend into the regions 14 and 16. In an embodiment, the anchors 122 and 125 have complementary shapes, and in a further embodiment, the anchors 122 and 125 are interlocking features. In another embodiment, anchors 122 and 125 lie along only one of the regions 14 or 16, and in a further embodiment, no anchors 122 or 125 are used.

The insulating structure 12 in FIG. 1 includes rounded corners. Many of the pillars 124 and 126 have I-beam shapes that include a pair of flanges spaced apart from each other by a web. Along the straight sections of the insulating structure, the pillars 124 are substantially identical to each other, and in a particular embodiment, the flange widths are substantially the same. Along the rounded corners, the I-beam shapes of the pillars 126 are modified to keep maximum spacing within the trench from exceeding a predetermined value. For the pillars 126 having an I-beam shape, the flange closer to the peripheral region 16 has a greater flange width as compared to the flange closer to the active region 14. For pillars 126, the flanges can be straight or curved to better match the arc of the curved region. At the transition between the straight sections and the rounded corners, the pillars can have still other shapes to help keep maximum spacing within the predetermined value.

Figure 2:
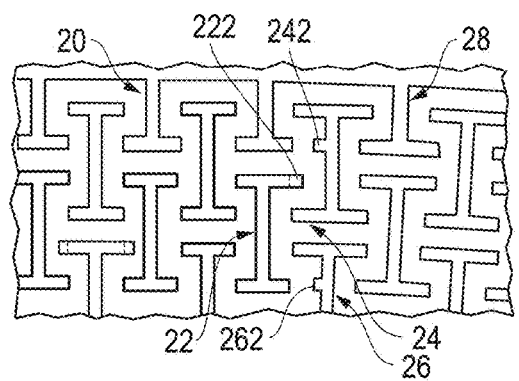
FIG. 2 includes an illustration of a top view of the electronic device of FIG. 1 having pillars for use at a transition between a straight section and a rounded corner of the insulating structure.
Figure 3:
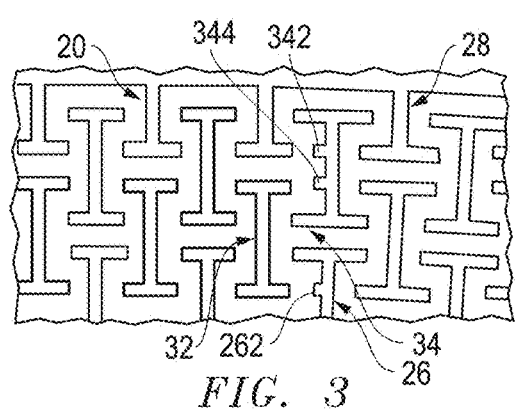
FIG. 3 includes an illustration of a top view of the electronic device of FIG. 1 having others pillars for use at a transition between a straight section and a rounded corner of the insulating structure.

FIGS. 2 and 3 illustrate how location of extensions from pillars can affect the maximum spacing. FIG. 2 includes an illustration of an embodiment in which pillars 22, 24, and 26 and anchor 28 have modified shapes that allow the maximum spacing to stay within limits. For the pillar 22, the upper flange includes an extension 222 that helps to keep the spacing between the flange of the pillar 22 and web of the pillar 24 more uniform. Further, the extension 222 is disposed between the flanges of the pillar 24 and helps to keep the maximum spacing within the trench from being exceeded. The pillar 24 has an extension 242 along the web of the I-beam to make the spacing between the extension 242 and the web of the pillar 24 more uniform with other parts of the trench. FIG. 2 includes a portion of the pillar 26 that has a shape similar to the pillar 24. The pillar 26 has an extension 262 along the web of the I-beam to make the spacing between the extension 262 and the lower flange of the pillar 22 more uniform. The extension 242 extends farther from the web of the pillar 24 than the extension 262 extends from the web of the pillar 26 because the pillar 24 is closer to the outer radius of the rounded corner. An anchor 20 is along a straight section of the isolation structure, and the anchor 28 is along the transition between a straight section and a rounded corner. Both have a T-shape (half of an I-shape), where the top of the T-shape is wider for the anchor 28 as compared to the anchor 20.

FIG. 3 is similar to FIG. 2; however, FIG. 3 includes an embodiment in which the maximum spacing limit is exceeded. In FIG. 3, the pillar 32 does not have the extension as seen with the extension 222 of the pillar 22 in FIG. 2. The pillar 32 has flanges with the same width. The pillar 34 is the same as pillar 24 except that it has an addition extension 344. The extension 342 has the same dimensions as extension 242, and the length of the extension 344 is shorter than the extension 342, which is closer to the outer radius of the rounded corner. The extension 344 on the pillar 34, instead of the extension 222 on pillar 22, causes too large of a gap in the y-direction, so that the ends of the flanges of the pillar 34 are directly exposed to each other in the trench, and therefore, the maximum spacing limit is exceeded. In a particular embodiment, the trench may not be properly filled with an insulating material and still achieve an embedded void adjacent to the pillar 34.

In another embodiment in which the trench is complete or nearly completely filled with an insulating material, such a limitation on maximum spacing may not be required.

Figure 4:
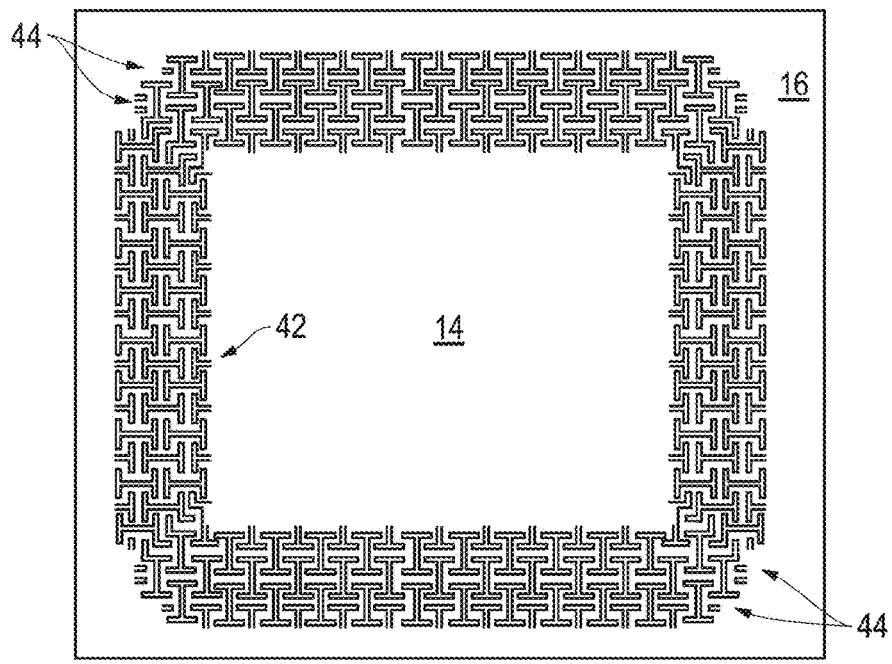
FIG. 4 includes an illustration of a top view of a portion of an electronic device including an insulating structure having anchors and clipped outer corners.
Figure 5:
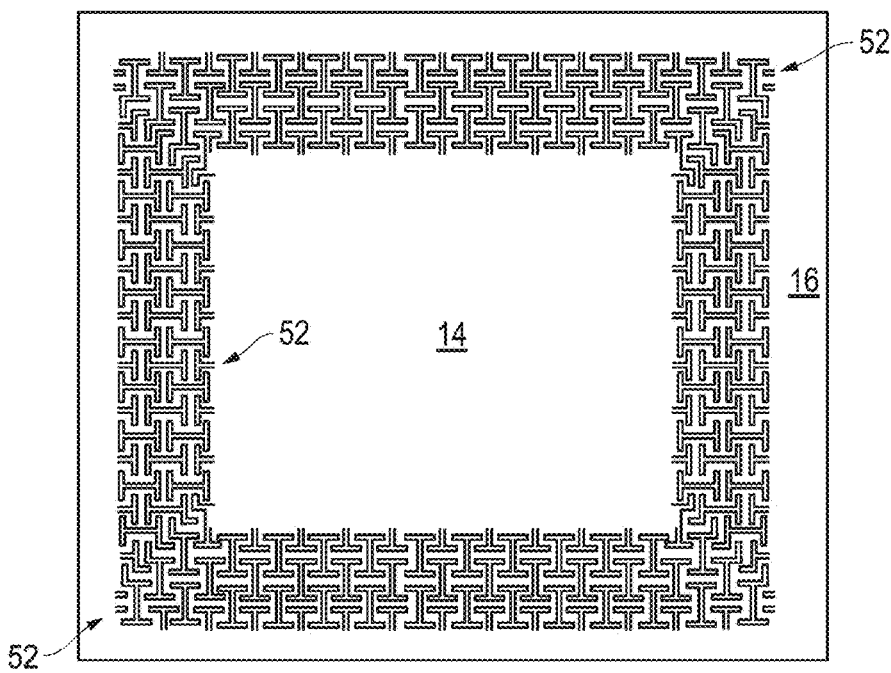
FIG. 5 includes an illustration of a top view of a portion of an electronic device including an insulating structure having anchors and square outer corners.

The issues with modified pillars may be omitted by using clipped outer corners, as illustrated in FIG. 4, or square outer corners, as illustrated in FIG. 5. In the embodiments of FIGS. 4 and 5, the pillars and anchors are the same throughout each of the insulating structures 42 and 52 except near the corners 44 and 54. However, the adjustments to the pillars and anchors at the corners are much easier to implement as compared to the rounded corners with the insulating structure 12. The insulating structure 12 with rounded corners may have better voltage breakdown characteristics as compared to the insulating structure 42, which may have better voltage breakdown characteristics as compared to the insulating structure 52. Thus, skilled artisans may have a tradeoff between better electronic characteristics and simplicity of design. After reading this specification, skilled artisans will be able to determine design that works best for a particular application, layout and manufacturing process flow.

Figure 6:
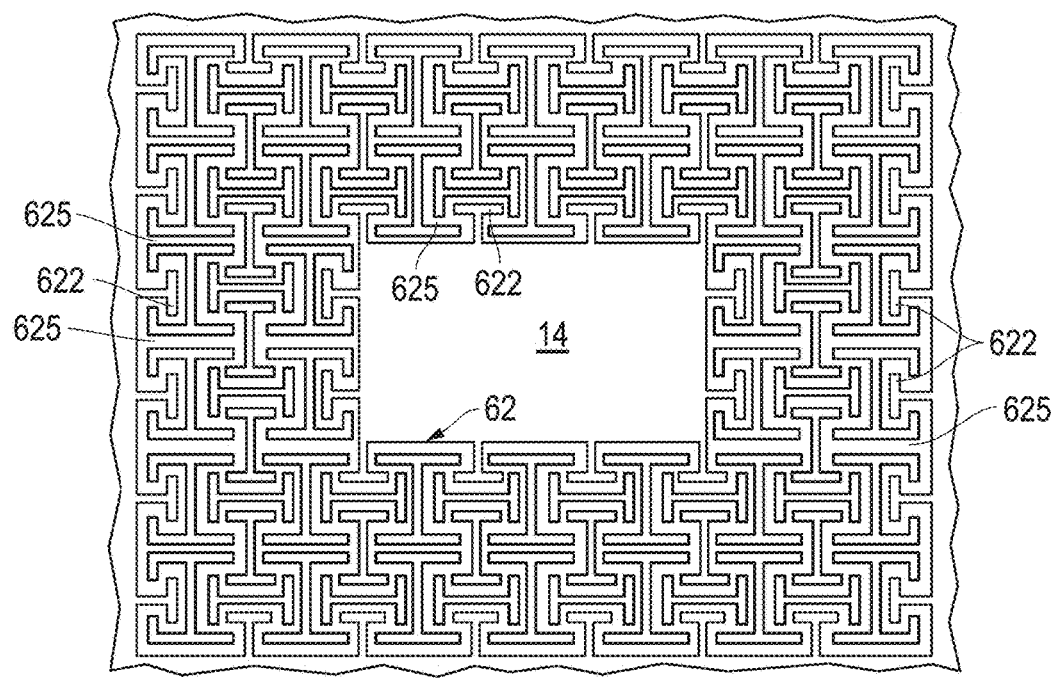
FIG. 6 includes an illustration of a top view of a portion of a workpiece including an insulating structure having anchors along opposite sides of the insulating structure.
Figure 7:
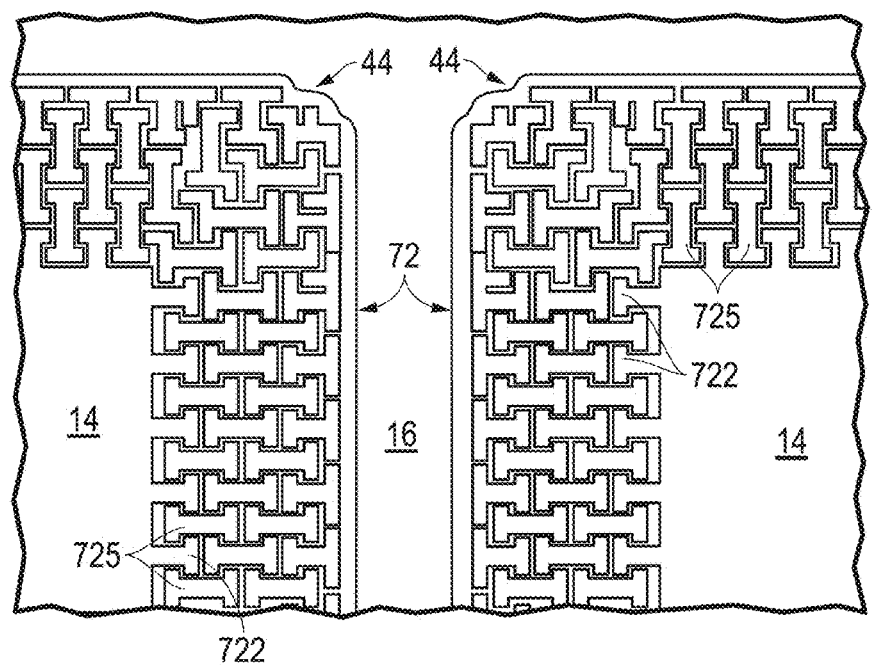
FIG. 7 includes an illustration of a top view of a portion of a workpiece including a pair of insulating structures each having s smooth outer side with a clipped outer corner and an inner side with anchors.

FIG. 6 includes an illustration of an embodiment in which anchors 622 and 625 are formed along an inner side and outer side of an insulating structure 62. FIG. 7 includes an illustration of an embodiment in which anchors 722 and 725 are formed along an inner side of an insulating structure 72 and no anchoring structures are formed along the outer side of the insulating structure 72. In an embodiment, the anchors 622 and 625 and the anchors 722 and 725 have complementary shapes, and in a further embodiment, the anchors 622 and 625 and the anchors 722 and 725 are interlocking features.

Anchors 622 and 625 along opposite sides of the insulating structure 62 allow for better mechanical integrity. Anchors may have localized points, such as near ends of the anchors, which can generate a locally higher electrical field. Thus, the lack of an anchor along the outer side of the insulating structure 72 may allow for a higher electrical field before breakdown occurs as compared to the same insulating structure 72 except with anchors along the outer side of the insulating structure 72. In another embodiment, the anchors 722 and 725 are not present, and the lack of any anchors along both the inner and outer sides of the insulating structure 72 may allow for an even higher electrical field before breakdown as compared to the insulating structure 72 in FIG. 7. Thus, skilled artisans may have a tradeoff between better electronic characteristics and mechanical integrity. After reading this specification, skilled artisans will be able to determine design that works best for a particular application.

Figure 8:
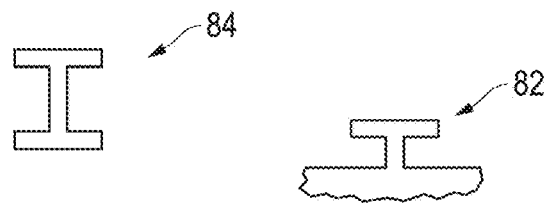
FIGS. 8 to 13 include illustrations of top views of exemplary shapes of pillars and anchors.
Figure 9:
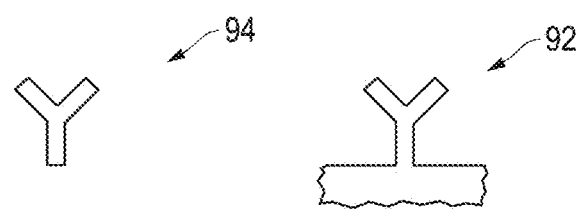
Figure 10:
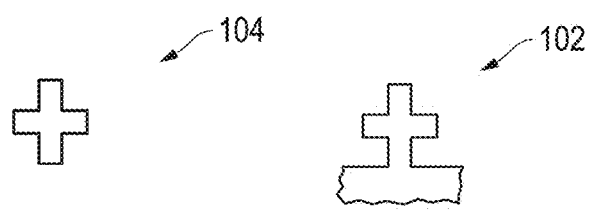
Figure 11:
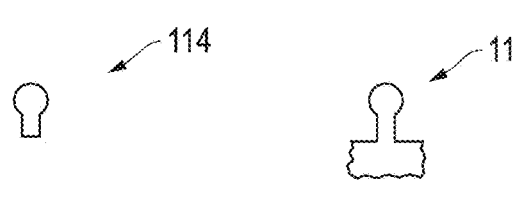
Figure 12:
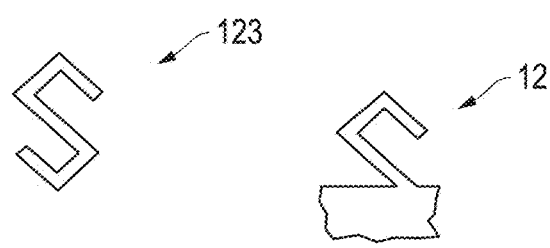
Figure 13:
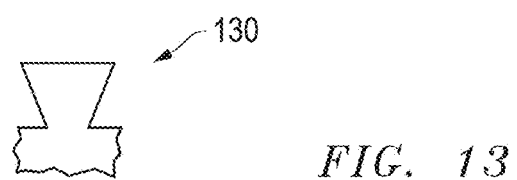

FIGS. 8 to 13 include exemplary shapes for pillars and anchors. In FIGS. 8 to 12, the left-hand drawing illustrates a shape of a pillar that would be spaced apart from a sidewall of the trench, and the right-hand drawing illustrates a corresponding feature that extends from a sidewall of the trench that can be used such a pillar. In FIG. 8, the pillar 84 has an I-shape, and the anchor 82 has a T-shape, which is a cutoff portion of the I-shape. In FIG. 9, each of the pillar 94 and anchor 92 has a Y-shape. In FIG. 10, each of the pillar 104 and the anchor 102 has a square cross shape. In FIG. 11, each of the pillar 114 and anchor 112 has a bulb-and-stick shape. In FIG. 12, the pillar 123 has a modified S-shape, and the anchor 121 has a hook, which is a cutoff portion of the modified S-shape. In FIG. 13, a feature 130 can be in the shape of a dovetail that is similar to the shape used in joints at corners in wooden furniture. The anchors as illustrated in FIGS. 8 to 13 are portions of substrates that extend from body portions of the substrates. Many of the anchors in FIGS. 8 to 13 have wider portions and narrower portions that are disposed between the body portions of the substrates and the wider portions. The anchor 121 is in the shape of a hook. Thus, the anchoring structures have shapes that help to resist separation of the substrates from the insulating structures. After reading this specification, others designs of anchors can be used without departing from the teachings of this specification.

Figure 14:
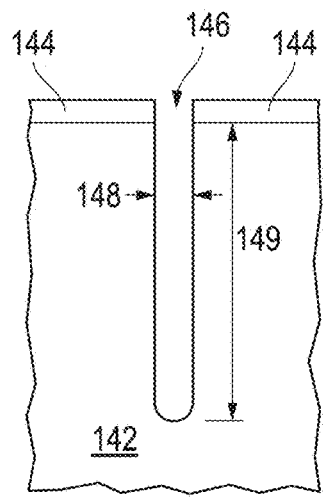
FIGS. 14 and 15 include illustrations of a cross-sectional view and a top view, respectively, of a portion of a workpiece after patterning a substrate to define a trench.
Figure 16:
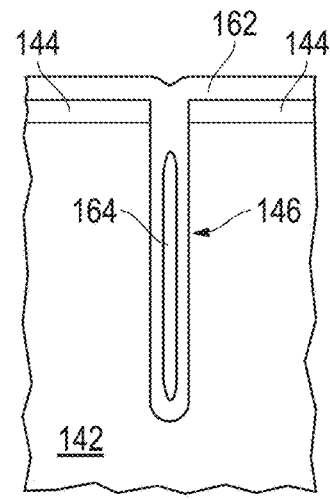
FIG. 16 includes an illustration of a cross-sectional view of the workpiece of FIG. 15 after forming an insulating layer having an embedded void within the trench.
Figure 15:
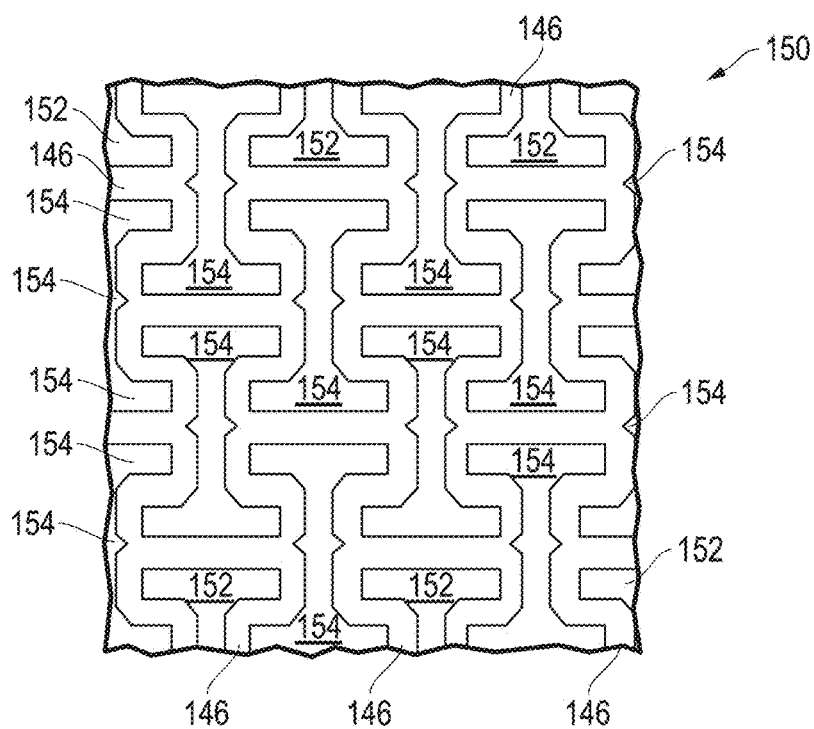
Figure 17:
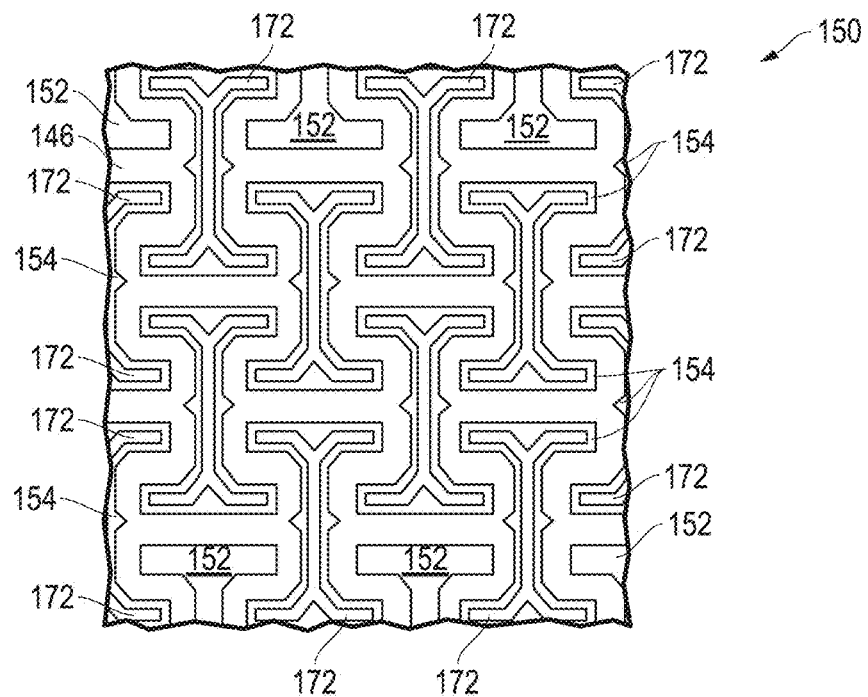
FIG. 17 includes an illustration of a top view of the workpiece of FIG. 16 after patterning the insulating layer.
Figure 18:
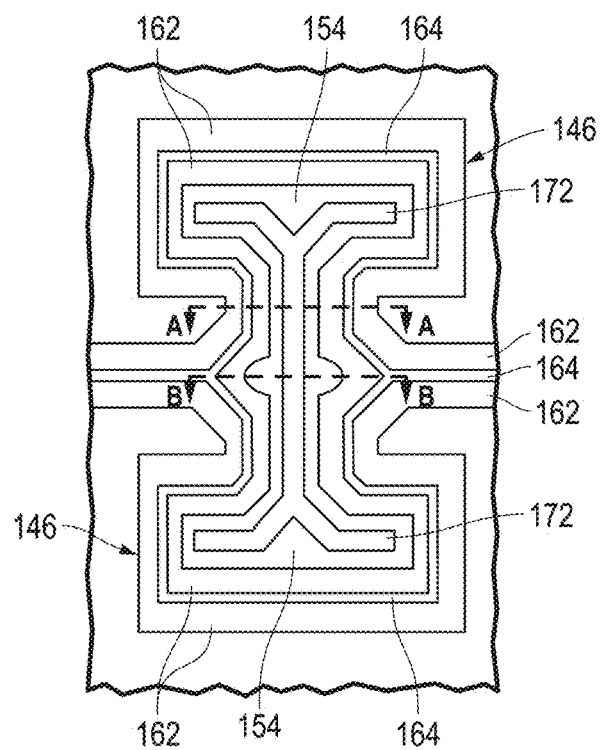
FIGS. 18 to 20 include illustrations of views of the workpiece of FIG. 17 at a different location as compared to illustrated in FIG. 17 after removing portions of the pillars to define cavities.

FIGS. 14 to 22 include process cross sections illustrating formation of a part of an insulating structure. FIGS. 15 and 17 correspond to a location on the workpiece, and FIG. 18 corresponds to another location. FIGS. 15 and 17 illustrate positional relationships between pillars, features, and the trench, and FIG. 18 illustrate a more complicated pillar structure. FIGS. 15 and 17 illustrate better how the structure in FIG. 18 is integrated into an insulating structure.

FIG. 14 includes a cross-sectional view of a portion of a workpiece after a substrate 142 is patterned to define trench 146. The substrate 142 can principally include a semiconductor material, such as a Group 14 element (for example, Si, Ge, C) or a compound semiconductor material. The compound semiconductor material can include Group 14 elements (for example, SiC or SiGe), a III-V compound, or a II-VI compound. The III-V compound can include III-N, III-P, III-As, and the III element may be selected from Al, Ga, In, or any combination thereof. The II-VI compound can include II-O, II-S, II-Se, or II-Te, and the II element can include Zn, Cd, Hg, Pb, or the like.

In the embodiment as illustrated, a hardmask layer 144 is formed over the substrate 142 and includes one or more films, each of which may include an oxide, nitride, oxynitride, polyimide, or the like. The hardmask layer 144 is patterned to define openings, and the substrate 142 is patterned to define the trench 146. FIG. 15 includes a top view of the workpiece at this point in the process flow. Within the insulating structure 150, portions of the substrate 142 that are not removed are anchors 152 and pillars 154, which have an I-beam shape in this embodiment.

In an embodiment, a subsequently-formed insulating layer will form embedded voids within the trenches. The pillars 154 have extensions along the webs of the I-beams to help the maximum spacing with the trench 146 from becoming too large, which would otherwise complicate the subsequently-formed insulating layer. The maximum spacing may be expressed in terms of spacings 148 within the trench 146 between different parts of the substrate 142, such as between pillars 154, between a pillar 154 and an anchor 152, or between a body portion of the substrate 142 (for example, active region 14 or peripheral region 16 in FIG. 1). For this particular embodiment, the spacings 148 may be at most 2 microns, at most 5 microns, or at most 10 microns.

In another embodiment, embedded voids will not be formed throughout the trench 146. In this embodiment, the maximum spacing between pillars 154 and between pillars 154 and anchors 152 may be controlled by another factor, such as dishing that could occur if a chemical mechanical polishing operation would be performed. Accordingly, the spacings 148 may be higher than any of the previously recited values and may exceed 20 microns.

If the spacings 148 are too small, a trench depth 149 may not be deep enough or a sufficient amount of insulating material of a subsequently-formed insulating layer may not form within the trench 146. In a particular embodiment, the spacings 148 are at least 1 micron.

The depth 149 of the trench 146 may depend in part on the application. In an embodiment, the insulating structure 146 is used in conjunction with a power device, such as a transistor designed to operate at a nominal voltage of 50 V or higher. As the voltage and the corresponding electrical field are relatively smaller, the trench 146 can be shallower, and when relatively greater, the trench may be deeper. If the insulating structure becomes exposed along the backside of a finished electronic device, the trench 146 may need to be even deeper. For many applications, the depth 149 is in a range of 11 microns to 200 microns, and may be in a range of 60 microns to 120 microns.

After forming the trench 146, the hardmask layer 144 may remain over the substrate 142 or may be removed (not illustrated).

FIG. 16 includes an illustration after forming an insulating layer 162 over the hardmask layer 144. The insulating layer 162 can include one or more films, each of which can include an oxide, nitride, oxynitride, polyimide, or the like.

In the embodiment illustrated in FIG. 16, an embedded void 164 is formed within the insulating layer 162. The insulating layer 162 can be deposited along exposed surfaces of the workpiece, including the bottom and sidewalls of the trench 146. The deposition rate is greater near the top of the trench 146, and thus, the trench 146 is sealed off as the deposition continues. The embedded void 164 allows for the formation of a sealed trench without having to completely fill the trench 146, which improves equipment throughput and reduces overall stress. In such an embodiment, the insulating layer 162 can be formed to a thickness of at least 0.5 micron, as measured over the hardmask layer 144 spaced away from the trench 146.

In another embodiment, a significant portion of the trench 146 may not have an embedded void 164 and such portion is completely filled with the insulating layer 162. The thickness of the insulating layer 162 may be a little more than (for example, 1% to 20% more than) (1) half of the width of such portion of the trench 146 or (2) the depth 149 of the trench, whichever of the two is smaller, to ensure the trench 146 is sufficiently filled. For example, if such portion has a width of 20 microns and a depth of 80 microns, half of the width, 10 microns, is less than the depth of 80 microns. Thus, the insulating layer 146 may be deposited in a range of 10.1 microns to 12 microns. In any of the foregoing embodiments, the pillars 154 may remain within the insulating structure 150 and formation of the insulating structure is substantially completed.

Figure 19:
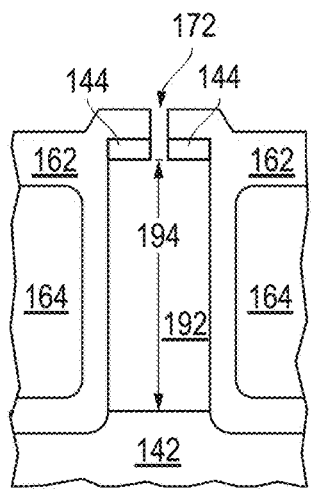
Figure 20:
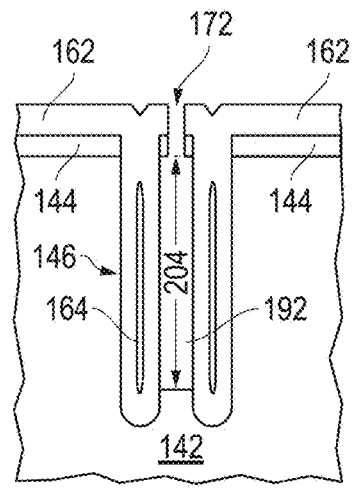
Figure 21:
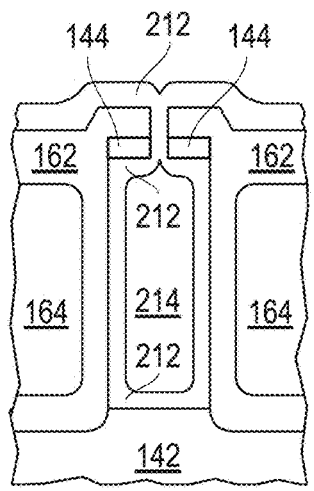
FIGS. 21 and 22 include illustrations of cross-sectional views of portions of the workpiece of FIGS. 18 to 20 after forming another insulating layer having embedded voids within the cavities.
Figure 22:
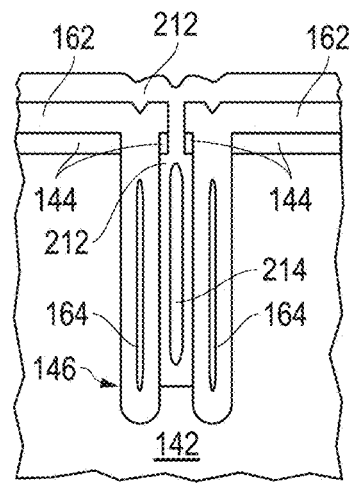

In another embodiment, one or more of the pillars 154 may be at least partly removed. FIGS. 17 to 20 include illustrations with respect to patterning the hardmask and insulating layers 144 and 162 and removing at least portions of pillars 154 to define cavities, while leaving the anchors 152 in place. Referring briefly to FIG. 18, the illustrations of FIGS. 19 and 21 are along sectioning line A-A in FIG. 18, and FIGS. 20 and 22 are along sectioning line B-B in FIG. 18. In FIGS. 17 and 18, portions of the insulating layer 162 within the trench 146 are not illustrated to simplify understanding the positional relationships between the trench 146, pillars 154 and anchors 152.

A masking layer (not illustrated) is formed over the insulating layer 162 and defines openings over portions of the hardmask and insulating layers 144 and 162. The hardmask and insulating layers 144 and 162 are patterned to define openings 172 that expose portions of the pillars 154, as illustrated in FIGS. 17 and 18. In the embodiment as illustrated, portions of all of the pillars 154 are exposed, and none of the anchors 152 are exposed, as they remain covered by the hardmask and insulating layers 144 and 162. In another embodiment (not illustrated), at least one pillar 154 may be unexposed (no opening over such pillar(s) 154).

The shape and maximum spacings within the openings 172 have similar considerations as described with respect to the shape and maximum spacings for the trench 146. Thus, the previously described considerations and values for the spacings of the trench 146 may be used for the openings 172. In an embodiment, embedded voids in a subsequently-formed insulating layer will be formed in a manner similar to the embedded voids 164 within the insulating layer 162, and therefore, the spacings within the openings 172 can have the values as previously described for the spacings 148 of the trench 146 with respect to an embodiment in which embedded voids are later formed. In another embodiment, an embedded void within an insulating layer will not be formed. In this embodiment, the maximum spacing within openings 172 may be controlled by another factor, such as dishing that could occur if a chemical mechanical polishing operation would be performed. Accordingly, the spacings within the openings 172 may be higher than values when embedded voids are to be formed within a subsequently-formed insulating layer.

At least portions of the pillars 154 are removed to define cavities, including cavity 192 as illustrated in FIGS. 19 and 20. In an embodiment, an isotropic wet or dry etchant is used to remove the exposed portion of the pillars 154. The semi-isotropic etchant allows portions of the pillars 154 that are covered by the hardmask and insulating layers 144 and 162 to be removed. Depths 194 and 204 may vary slightly from location to location within the cavity 192. For example, the portion of the cavity 192 within FIG. 19 is wider and allows the etchant and etching product to move more freely, as compared to the portion of the cavity within FIG. 20. Therefore, the depth 194 is greater than the depth 204. The etching may continue as long as the insulating layer 162 within the trench 146 is not significantly undercut. In an embodiment, at least a part of the pillars 154 remain between portions of the insulating layer 162 within the trench 146 to help with mechanical support of the insulating layer 162 within the trench 146. Although there is no minimum amount of the pillars 154 to remove, at least 10% of the pillars 154 may be removed. Thus, the depths 194 and 204 may in a range of 10% to 110% of the heights of the pillars 154 (corresponding to the depth of the trench 146).

In the embodiment illustrated in FIGS. 21 and 22, embedded void 214 is formed within an insulating layer 212. The insulating layer 212 can be deposited along exposed surfaces of the workpiece, including the bottom and sidewalls of the cavities, including cavity 192. The deposition rate is greater near the opening 172, and thus, the cavity 192 is sealed off as the deposition continues. The embedded void 192 allows for the formation of a sealed cavity without having to completely fill the cavity 192, which improves equipment throughput. In such an embodiment, the insulating layer 212 can be formed to a thickness of at least 0.4 micron, as measured over the insulating layer 162 spaced away from the cavity 192.

In another embodiment (not illustrated in FIGS. 21 and 22), a cavity may not have an embedded void and such portion is completely filled with the insulating layer 212. The thickness of the insulating layer 212 may be determined using similar considerations as previously described with respect to an embodiment in which the insulating layer 162 completely fills a significant portion of the trench 146.

At this point in the process, the formation of the insulating structure is substantially complete. Electronic components within the active region 14 or within both of the active and peripheral regions 14 and 16 may have been formed before forming the insulating structure or may be formed after forming the insulating structure.

FIGS. 23 to 31 illustrate an embodiment in which high voltage issues may be a concern. For example, an electronic device may be designed to operate at a voltage that could cause charge to build up within a molding compound. In workpiece 230, the insulating structure 231 in FIGS. 23 to 31 is used as part of a termination region that separates an active region 233 from a peripheral region 235 that includes a dicing street.

Figure 23:
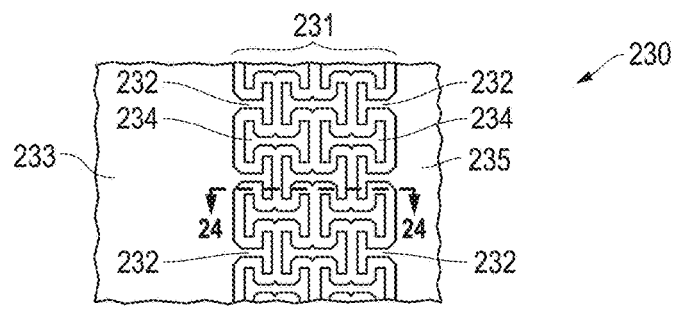
FIGS. 23 and 24 include illustrations of a top view and a cross-sectional view, respectively, of a portion of a workpiece after patterning a substrate to define a trench for an insulating structure near a termination region of an electronic device.
Figure 24:
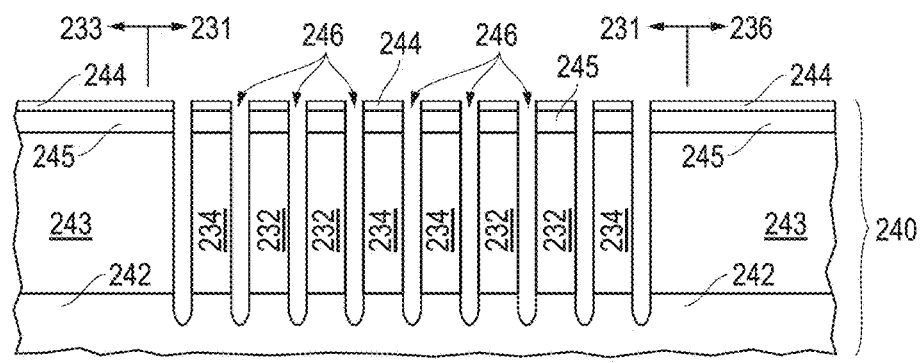

FIGS. 23 and 24 include illustrations of the workpiece 230 after defining trench 246 to define the pillars 234 and the anchors 232. FIG. 24 is a cross-sectional view along sectioning line 24-24 in FIG. 23. The workpiece includes a substrate 240 that can include a base material 242, a semiconductor layer 243, and a heavily doped region 245. The base material 242 can include a heavily doped semiconductor material, such as an $N^+$ or a $P^+$ wafer, and the semiconductor layer 243 can be epitaxial grown from the base material 242. The semiconductor layer 243 can be relatively lightly doped and of the same conductivity type as the base material 242. In a particular embodiment, a portion of the semiconductor layer 243 can be a drift region for a transistor. The semiconductor layer 243 can have the same conductivity type as the base material 242, and therefore, the semiconductor layer 243 can be $N^-$ or $P^-$ layer. The thickness of the semiconductor layer 243 may depend on the operating voltage for the electronic device. In an embodiment, the semiconductor layer 243 can have a thickness in a range of 1 to 5 microns. The heavily doped region 245 can be formed from an upper portion of the semiconductor layer 243. The heavily doped region 245 can have a conductivity type opposite that of the substrate 242 and the semiconductor layer 243. In an embodiment, the heavily doped region can be a $P^+$ or $N^+$ region. The heavily doped region 245 may not be formed along all of the surface of the workpiece 230, such as within the active region 233 farther from the insulating structure 231. A hardmask layer 244 is formed over the heavily doped region 245. The hardmask layer 244 can include any of the materials or formation techniques as previously described within to the hardmask layer 144.

Openings are formed through the hardmask layer 244, and the heavily doped region 245 and the semiconductor layer 243 are patterned to define the trench 246 within the substrate 240. The trench 246 can have any of the spacings and use the previously described design considerations as previously described with respect to the trench 146. The depth of the trench 246 may extend completely through the semiconductor layer 243 to expose the base material 242, as illustrated in FIG. 24, or may extend mostly through the semiconductor layer 243 but not expose the base material 242 (not illustrated).

Figure 25:
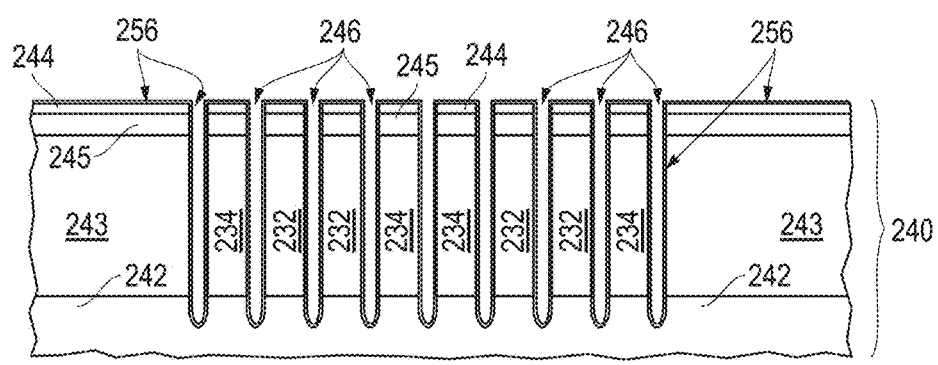
FIG. 25 includes an illustration of a cross-sectional view of the workpiece of FIGS. 23 and 24 after forming a dopant-containing layer over the substrate and within the trench.
Figure 26:
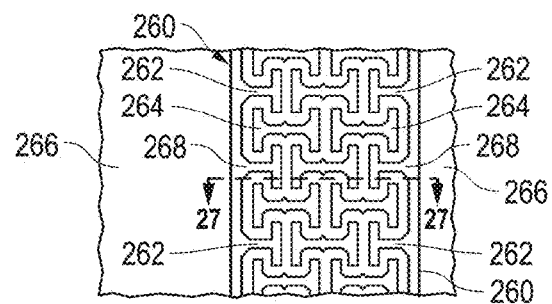
FIGS. 26 and 27 include illustrations of a top view and a cross-sectional view, respectively, of the workpiece of FIG. 25 after driving dopant from the dopant-containing layer and removing the dopant-containing layer.
Figure 27:
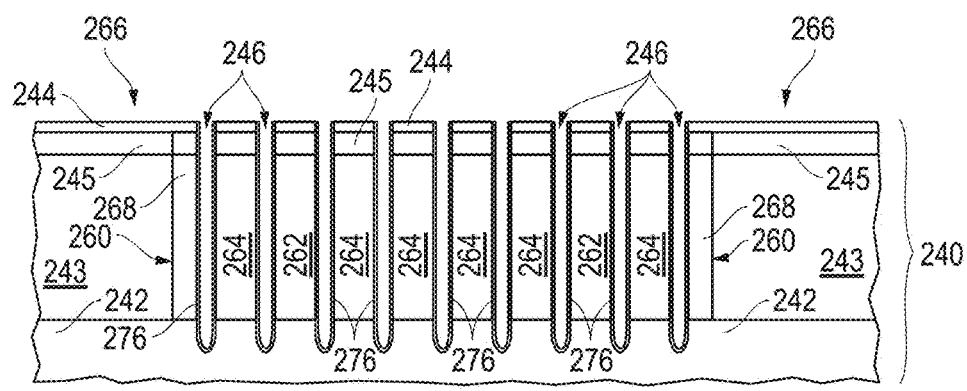

Sidewalls of the trench 246 may be doped as illustrated in FIGS. 25 to 27. In an embodiment, a dopant-containing layer 256 can be formed along exposed portions of the workpiece 230. The dopant-containing layer 256 includes a dopant having a conductivity type opposite that of the substrate 242 and the semiconductor layer 243. When the base material 242 is an $N^+$ wafer, the dopant-containing layer 256 can include a p-type dopant, such as boron. In a particular embodiment, the dopant-containing layer 256 can be boron-doped polysilicon or a borosilicate glass. The thickness of the layer 256 does not completely fill the trench 246. In an embodiment, the dopant-containing layer 256 is formed to a thickness in a range of 3 nm to 50 nm.

Dopant from dopant-containing layer 256 is driven to form the doped regions 260, which includes the pillars 264, the anchors 262 and adjacent portions of the regions 243 and 245 that are adjacent to the trench 266, as illustrated in FIGS. 26 and 27. FIG. 27 is a cross-sectional view along sectioning line 27-27 in FIG. 26. In a particular embodiment, the substrate 240 includes body portions 266 and adjacent portions 268 from which the doped anchors 262 extend. The adjacent portions 268 have a conductivity type opposite that of the base material 242 and are disposed between body portions 266 and the doped anchors 262. The dopant-containing layer 256 can be removed or retained. In an embodiment, all of the dopant-containing layer 256 is removed, and the exposed surfaces of the heavily doped region 245, the semiconductor layer 243, and the substrate 242 (if the trench 246 extends to the substrate 242) are oxidized. In another embodiment when the dopant-containing layer 256 includes silicon, portions of the dopant-containing layer 256 along horizontal surfaces and along the bottom of the trench 246 is removed, and portions of the dopant-containing layer 256 along sidewalls of the trench 246, the pillars 264 and anchors 262 are oxidized to form an oxide layer 276 along the sidewalls of the trench 246, the pillars 264, and anchors 262. The oxide layer 276 is also formed along the bottom of the trench 246. The hardmask layer 244 may be removed if needed or desired.

In an alternative embodiment, the dopant may be introduced by an angle implant, plasma immersion doping, or the like. The dopant drive as previously described is performed to drive the dopant. In this embodiment, a doping is performed without forming a dopant-containing layer, so complications that may be caused by a dopant-containing layer may be obviated.

Figure 28:
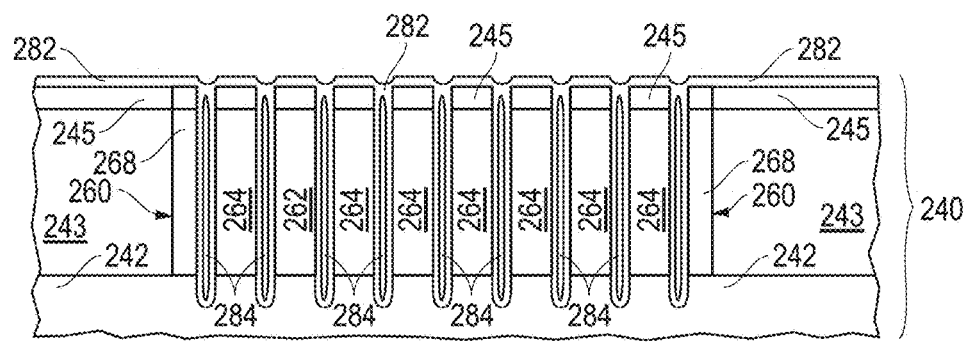
FIG. 28 includes an illustration of a cross-sectional view of the workpiece of FIGS. 26 and 27 after forming an insulating layer having an embedded void within the trench.

The processing as illustrated in FIGS. 28 to 31 is similar to the processing as previously described with respect to FIGS. 16 to 22. An insulating layer 282 is formed over the heavily doped region 245, the doped regions 260 and within the trench 246, as illustrated in FIG. 28. Embedded voids 284 may or may not be formed within the insulating layer 282. Design alternatives as previously described with respect to the insulating layer 162 are applicable to the insulating layer 282.

Figure 29:
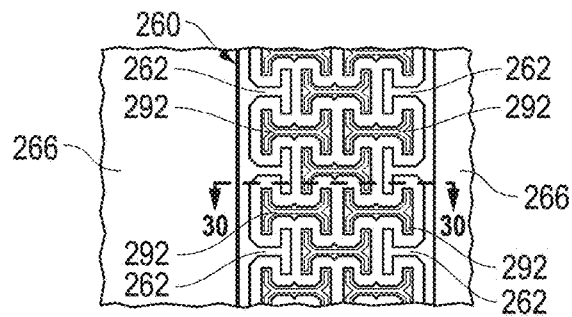
FIGS. 29 and 30 include illustrations of a top view and a cross-sectional view, respectively, of the workpiece of FIG. 28 after patterning the insulating layer and removing portions of the pillars to define cavities.

A masking layer (not illustrated) is formed over the insulating layer 282 and defines openings over portions of the insulating layer 282. The insulating layer 282 is patterned to define openings 292 that expose portions of the doped pillars 264, as illustrated in FIG. 29. In the embodiment as illustrated, portions of all of the doped pillars 264 are exposed, and none of the doped anchors 262 are exposed, as they remain covered by the insulating layer 282. In another embodiment (not illustrated), at least one pillar 264 may be unexposed (no opening over such pillar(s) 264). The considerations for the shape and maximum spacings within the openings 292 have the same considerations as described with respect to the shape and maximum spacings for the openings 172.

Figure 30:
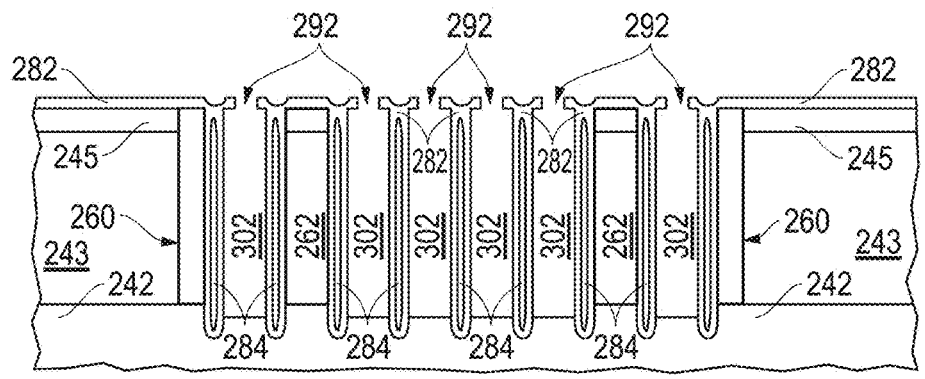

At least portions of the doped pillars 264 are removed to define cavities 302, as illustrated in FIG. 30. FIG. 30 is a cross-sectional view along sectioning line 30-30 in FIG. 29. Considerations when removing the doped pillars 264 and defining the cavities 302 are the same as previously described with respect to the pillars 154 and the cavity 192.

Figure 31:
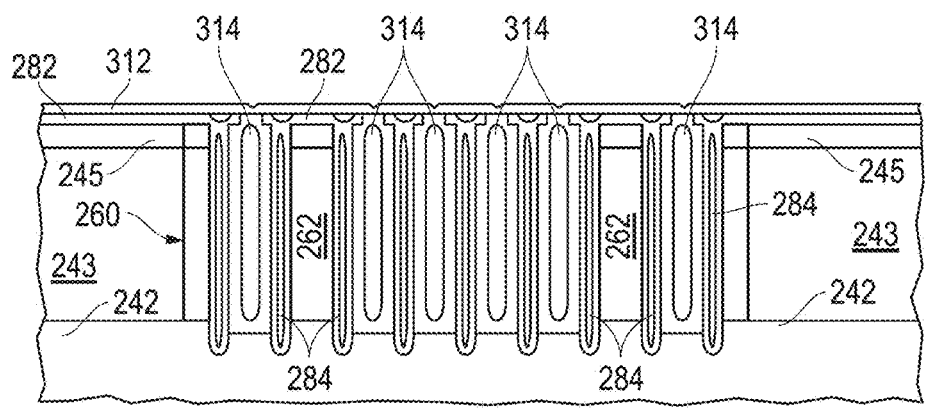
FIG. 31 includes an illustration of cross-sectional view of the workpiece of FIGS. 29 to 30 after forming another insulating layer having embedded voids within the cavities.

An insulating layer 312 is formed over insulating layer 282 and within the openings 292 and cavities 302. FIG. 31 includes a cross-sectional view of the workpiece at this point in the process. Embedded voids 314 are formed within the insulating layer 312. Considerations when forming the insulating layer 312 and the embedded voids 314 are the same as previously described with respect to the insulating layer 212 and embedded void 214. In another embodiment (not illustrated in FIG. 31), a cavity may not have an embedded void and such portion is completely filled with the insulating layer 312. The thickness of the insulating layer 312 may be determined using similar considerations as previously described with respect to an embodiment in which the insulating layer 162 completely fills a significant portion of the trench 146.

Figure 32:
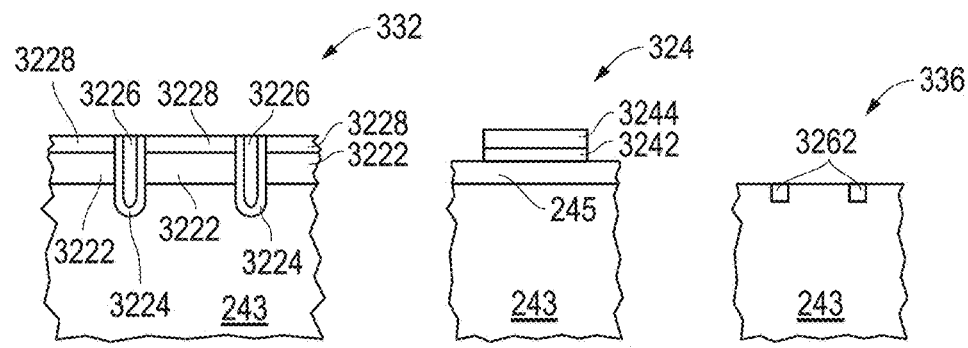
FIG. 32 includes illustrations of cross-sectional views of exemplary components that may be formed within an active region of the workpiece of FIG. 31.

At this point in the process, the formation of the insulating structure is substantially complete. Electronic components within the active region 14 or within both of the active and peripheral regions 14 and 16 may have been formed before forming the insulating structure or may be formed after forming the insulating structure. FIG. 32 includes some exemplary, non-limiting electronic components that can be formed. A transistor 322 includes a body region 3222 that includes the channel region for the transistor 322. The workpiece is patterned to remove portions of the body region 3222 and the semiconductor layer 243 to form openings where gate structures are to be formed. A gate dielectric layer 3224 is formed within the openings, and gate electrodes 3226 are formed within the openings. A source region 3228 is formed along the surface and has the same conductivity type as the semiconductor layer 243 and opposite the body region 3222. A body contact region for the body region 3222 is formed at a location outside of the illustration in FIG. 32. The portion of the semiconductor layer 243 within FIG. 32 is a drift region for the transistor 322, and a portion of the substrate 242 (not illustrated in FIG. 32) underlying the drift region is a heavily doped drain region for the transistor 322.

FIG. 32 further includes a capacitor 324, wherein the heavily doped region 245 is an electrode for the capacitor. An insulating layer 3242 is formed over the heavily doped region 245, and another electrode 3244 of the capacitor 322 is formed over the insulating layer 3242. FIG. 32 still further includes a resistor 326, which is a portion of the semiconductor layer 243 lying between heavily doped regions 3262 that allow ohmic contacts to be formed for the resistor 326. The semiconductor layer 243 and the heavily doped regions 3262 have the same conductivity type. Other types of electronic components may be used but are not illustrated.

Figure 33:
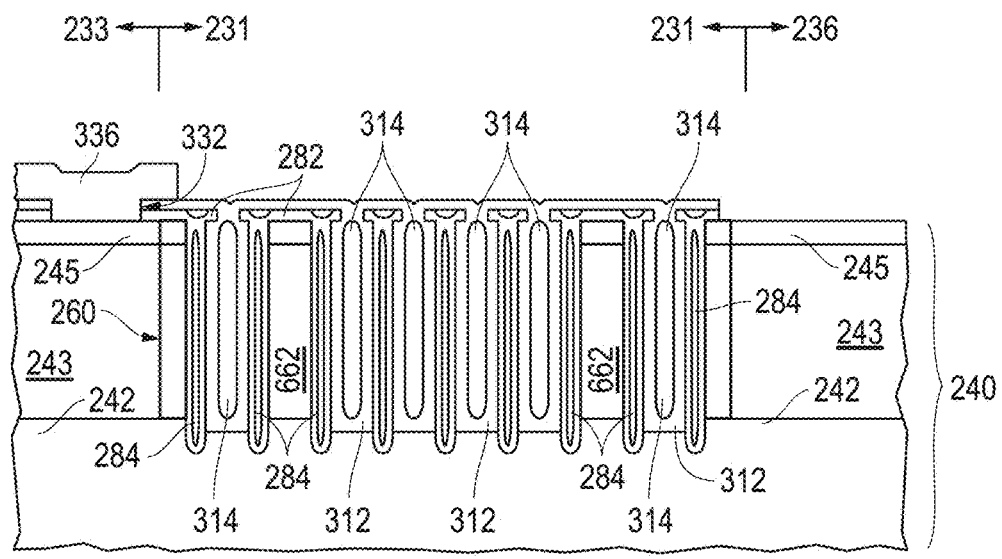
FIG. 33 includes an illustration of a cross-sectional view of the workpiece of FIG. 32 after forming a substantially completed electronic device.

After forming electronic components, interconnects can be formed. The insulating layers 282 and 312 are patterned to define contact openings, such as a contact opening 332, and to clear the dicing streets, such as a dicing street 236, as illustrated in FIG. 33. Interconnects are formed over the insulating layer 312 and within the contact openings. FIG. 33 includes an interconnect 336 that extends into the contact opening 332 and forms an ohmic contact with the heavily doped region 245.

Many different embodiments provide many different benefits. After reading this specification, skilled artisans will understand that they may have design choices, and therefore, not all of the concepts as described with respect to particular embodiments need to be implemented. Below are some exemplary benefits that are illustrative and not limiting to the scope of the invention.

Figure 34:
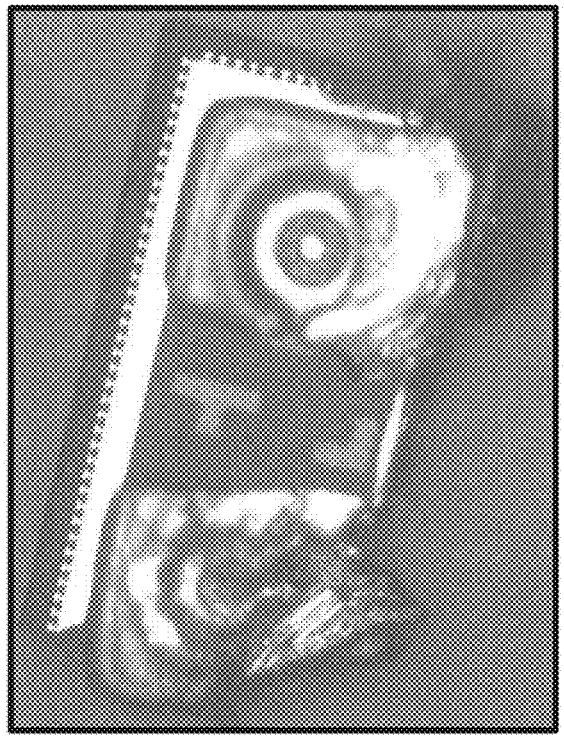
FIG. 34 includes pictures of an electronic device having an insulating structure with anchors before and after destructive testing of the electronic device.
Figure 34:
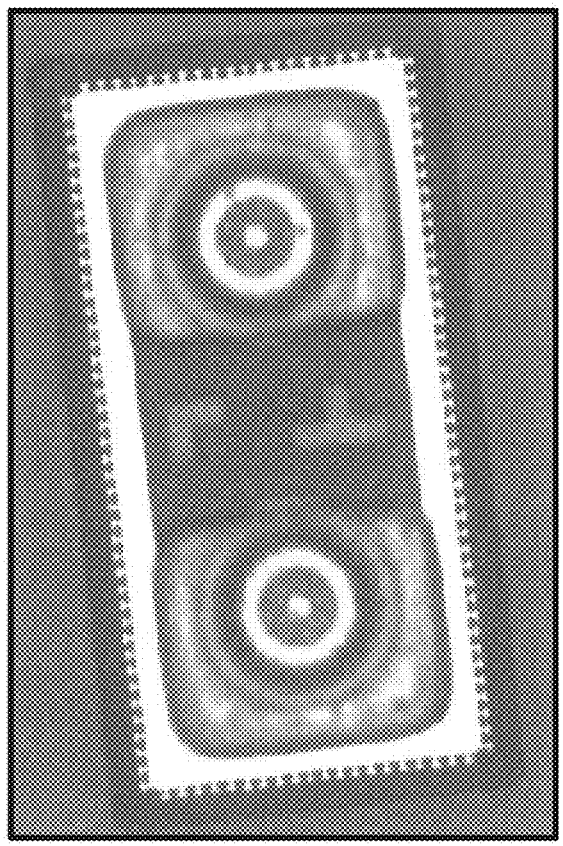

Anchors help to keep the insulating structure attached to the substrate. FIG. 34 includes pictures of an electronic device before and after destructive testing. The anchors are along the outer edge of the insulating structure where it meets a silicon substrate. After destructive testing, the insulating structure breaks along with the silicon substrate, as can be seen with the picture near the right-hand side of FIG. 34. If the insulating structure did not have anchors, the insulating structure may break or separate from the silicon substrate before the silicon breaks. Accordingly, the insulating structure with anchors has better mechanical integrity when the insulating structure is integrated into the substrate.

A field electrode can help improve the breakdown voltage across the insulating structure between two regions (for example, between regions 14 and 16) and reduce or block charging of a mold compound. In an embodiment, the anchors may lower the breakdown voltage of the insulating structure. For example, an insulating region with smoother inner and outer sides (no anchors) may have a breakdown voltage of 700 V. An insulating structure with anchors along one or both sides of the insulating structure may have a breakdown voltage of 500 V. The use of the doped region 260 can act as a field plate to reduce the effect of local points of higher field adjacent to the anchors and allow the breakdown for the insulating structure to reach 700 V. Further, the embodiment also can reduce charging of a mold compound that may otherwise occur. The doped region 260 may be connected to a fixed potential or may be allowed to electrically float. Thus, a relatively easy-to-implement solution can be used to address high electrical field issues that may arise with anchors or mold compounds.

The insulating structure can be formed using two insulating layers with embedded voids. The embedded voids can be formed when openings are sealed off during the depositions of the insulating layers. The thickness of the depositing insulating layers in forming the insulating structure can be greatly reduced because the entire trench is not being filled with an insulating layer. Thus, the insulating structure can be formed with less insulating material and allows for higher equipment throughput and lower stress.

Furthermore, as compared to a conventional process in which pillars are thermally oxidized, the insulating structure as described herein can be formed with a substantially lower thermal budget. In the conventional process, the thermal oxidation may be performed at a temperature of at least 1000° C. for several hours. Thus, for the conventional process, the insulating structure will need to be formed early in the process flow, such as before forming any transistors or capacitors. For the insulating structure described herein, it may be formed by depositions that do not exceed 750° C. Thus, the timing when forming the insulating structure is more flexible and can be incorporated before, during, or after electronic components are formed. In an embodiment, the insulating layers for the insulating structure may be part of the interlevel dielectric (ILD) layers that are part of an ILD/interconnect sequence.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

1. An electronic device comprising:
   a substrate;
   an insulating structure; and
   a first anchor including a portion of the substrate that extends into the insulating structure or a portion of the insulating structure that extends into the substrate.

Embodiment 2

The electronic device of Embodiment 1, wherein the insulating structure has first and second opposing sides, wherein the first side includes the first anchor, and the second side does not include an anchor.

Embodiment 3

The electronic device of Embodiment 1, wherein the first anchor is the portion of the substrate and has a first conductivity type; and the substrate includes a body portion and an adjacent portion from which the first anchor extends, wherein the adjacent portion has the first conductivity type is disposed between the body portion and the first anchor, and the body portion has a second conductivity type opposite the first conductivity type.

Embodiment 4

The electronic device of Embodiment 1, wherein:
   the substrate includes a first body portion, a second body portion, and a second anchor;
   the insulating structure has first and second opposing sides;
   the first anchor extends from the first body portion of the substrate and lies along the first side of the insulating structure; and
   the second anchor extends from the second body portion of the substrate and lies along the second side of the insulating structure.

Embodiment 5

The electronic device of Embodiment 1, wherein the substrate includes the first anchor, and the insulating structure includes a second anchor.

Embodiment 6

The electronic device of Embodiment 5, wherein the first and second anchors have complementary shapes.

Embodiment 7

The electronic device of Embodiment 5, wherein:
   the substrate includes a first set of anchors that includes the first anchor;
   the insulating structure includes a second set of anchors that includes the second anchor; and
   a combination of the first and second sets of anchors forms interlocking features.

Embodiment 8

The electronic device of Embodiment 1, wherein in a finished device the insulating structure has a height that is less than a thickness of the substrate.

Embodiment 9

The electronic device of Embodiment 1, wherein the first anchor extends from a body portion of the substrate or the insulating structure, and the first anchor has a wider portion and a narrower portion that is disposed between the body portion and the wider portion.

Embodiment 10

A process of forming an electronic device comprising patterning a substrate to define a trench and a first anchor; and forming an insulating structure within the trench and adjacent to the first anchor.

Embodiment 11

The process of Embodiment 10, wherein:
patterning the substrate further defines a first pillar within the trench; and
forming the insulating structure comprises:
  forming a first insulating layer within the trench;
  removing at least a portion of the first pillar after forming the first insulating layer to create a cavity; and
  forming a second insulating layer to at least partly fill the cavity.

Embodiment 12

The process of Embodiment 11, wherein a combination of the first and second insulating layers forms a second anchor that has a complementary shape to the first anchor.

Embodiment 13

The process of Embodiment 11, wherein the first pillar has an I-beam shape that includes a first flange, a second flange, and a web disposed between the first and second flanges.

Embodiment 14

The process of Embodiment 13, wherein a section of the web is wider and spaced apart from the first and second flanges.

Embodiment 15

The process of Embodiment 13, wherein the insulating structure has clipped outer corners.

Embodiment 16

The process of Embodiment 10, further comprising doping the first anchor to change a conductivity type of the first anchor.

Embodiment 17

The process of Embodiment 10, further comprising thinning the substrate to expose at least a portion of the insulating structure along a backside of the substrate.

Embodiment 18

A process of forming an electronic device comprising:
patterning a substrate to define a trench having a sidewall and a first pillar spaced apart from the sidewall;
doping the first pillar to change a conductivity type of the first pillar; and
forming an insulating structure that surrounds the first pillar.

Embodiment 19

The process of Embodiment 18, wherein patterning the substrate further defines a second pillar spaced apart from the first pillar and the sidewall; and the process further comprises removing at least a portion of the second pillar to create a cavity.

Embodiment 20

The process of Embodiment 19, wherein forming the insulating structure comprises:
forming a first insulating layer within the trench;
removing at least a portion of the second pillar is performed after forming the first insulating layer, wherein a cavity is not formed immediately adjacent to the first pillar; and
forming a second insulating layer to at least partly fill the cavity.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
patterning a substrate to define a trench and a first anchor having a proximal portion and a distal portion, wherein
  the first anchor extends from a sidewall of the trench,
  the sidewall is closer to the proximal portion than to the distal portion, and
  the proximal portion has a width that is less than a width of the distal portion; and
forming an insulating structure within the trench and adjacent to the first anchor.

2. The process of claim 1, wherein:
patterning the substrate further defines a first pillar within the trench; and
forming the insulating structure comprises:
  forming a first insulating layer within the trench;
  removing at least a portion of the first pillar after forming the first insulating layer to create a cavity; and
  forming a second insulating layer to at least partly fill the cavity.

3. The process of claim 2, wherein a combination of the first and second insulating layers forms a second anchor that has a complementary shape to the first anchor.

4. The process of claim 2, wherein the first pillar has an I-beam shape that includes a first flange, a second flange, and a web disposed between the first and second flanges.

5. The process of claim 4, wherein a section of the web is wider and spaced apart from the first and second flanges.

6. The process of claim 4, wherein the insulating structure has clipped outer corners.

7. The process of claim 1, further comprising doping the first anchor to change a conductivity type of the first anchor.

8. The process of claim 1, further comprising thinning the substrate to expose at least a portion of the insulating structure along a backside of the substrate.

9. A process of forming an electronic device including a termination region, the process comprising:
   patterning a substrate to define a trench having a sidewall and a first pillar spaced apart from the sidewall;
   doping the first pillar to change a conductivity type of the first pillar; and
   forming an insulating structure that surrounds the first pillar,
   wherein the first pillar and the insulating structure are within the termination region.

10. The process of claim 9, wherein:
    patterning the substrate further defines a second pillar spaced apart from the first pillar and the sidewall; and
    the process further comprises removing at least a portion of the second pillar to create a cavity.

11. The process of claim 10, wherein forming the insulating structure comprises:
    forming a first insulating layer within the trench;
    removing at least a portion of the second pillar is performed after forming the first insulating layer, wherein a cavity is not formed immediately adjacent to the first pillar; and
    forming a second insulating layer to at least partly fill the cavity.

12. The process of claim 9, wherein:
    patterning the substrate further comprises patterning the substrate to define an anchor extending from the sidewall of the trench; and
    doping the anchor to change a conductivity type of the anchor, wherein the anchor and the first pillar have a same conductivity type after the anchor and first pillar are doped.

13. The process of claim 12, wherein forming the second insulating layer within the cavity is performed such that the second insulating layer seals the cavity.

14. The process of claim 9, further comprising:
    doping a surface doped region along an upper surface of the substrate outside the trench and within the termination region; and
    forming a molding compound over the substrate and termination region,
    wherein the substrate has a conductivity type that is an opposite conductivity type of the surface doped region and the first pillar after doping the first pillar.

15. A process of forming an electronic device comprising:
    patterning a substrate to define a trench having a sidewall and a first pillar, wherein the first pillar is a part of the substrate and spaced apart from the sidewall;
    forming a first insulating layer within the trench;
    removing at least a portion of the first pillar after forming the first insulating layer, wherein a cavity is formed where the at least a portion of the first pillar is removed, and the cavity is immediately adjacent to the first insulating layer where the at least a portion of the first pillar is removed; and
    forming a second insulating layer within the cavity.

16. The process of claim 15, wherein patterning the substrate further defines a first anchor and a second anchor pillar, wherein:
    the first and second anchors extend from the sidewall of the trench,
    each of the first and second anchors and the first pillar includes a middle portion and an end portion, and
    the end portion of the of the first pillar is disposed between and extends toward the middle portions of the first and second anchors, and
    the middle portion of the first pillar is disposed between the end portions of the first and second anchors, and the end portions of the first and second anchors extend toward the middle portion of the first pillar.

17. The process of claim 15, wherein patterning the substrate further defines an anchor and a second pillar spaced apart from the anchor and the first pillar, wherein:
    the anchor extends from the sidewall of the trench,
    each of the anchor and the first and second pillars includes a middle portion and an end portion, and
    the end portion of the of the anchor is disposed between and extends toward the middle portions of the first and second pillars, and
    the middle portion of the anchor is disposed between the end portions of the first and second pillars, and the end portions of the first and second pillars extend toward the middle portions of the anchor.

18. The process of claim 17, wherein patterning the substrate is performed such that:
    the anchor has an T-shape, and the first and second pillars have I-beam shapes, and
    ends of the I-beam shapes of the first and second pillars are adjacent to and along opposite sides of a stem of the T-shape of the anchor, and
    the ends of the I-beam shapes of the first and second pillars are disposed between the sidewall of the trench and a cross-bar of the T-shape of the anchor.

19. The process of claim 15, wherein patterning the substrate further defines an anchor extending from the sidewall of the trench, wherein the anchor has a T-shape, a Y-shape, a square cross shape, a bulb-and-stick shape, a hook shape, or a dovetail shape.

20. The process of claim 15, wherein:
    patterning the substrate further defines an anchor extending from the sidewall of the trench and spaced apart from the first pillar, and
    removing at least a portion of the first pillar does not remove any part of the anchor.

* * * * *